United States Patent
Kato

(10) Patent No.: US 10,290,686 B2
(45) Date of Patent: May 14, 2019

(54) DISPLAY DEVICE AND METHOD OF MANUFACTURING THE SAME

(71) Applicant: Japan Display Inc., Tokyo (JP)

(72) Inventor: Daisuke Kato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/656,065

(22) Filed: Jul. 21, 2017

(65) Prior Publication Data

US 2018/0033840 A1 Feb. 1, 2018

(30) Foreign Application Priority Data

Aug. 1, 2016 (JP) ................................. 2016-151166

(51) Int. Cl.
| | |
|---|---|
| *G02B 5/30* | (2006.01) |
| *H01L 27/32* | (2006.01) |
| *G02B 1/14* | (2015.01) |
| *H01L 51/00* | (2006.01) |
| *H01L 51/56* | (2006.01) |
| *H01L 51/52* | (2006.01) |
| *G02B 27/28* | (2006.01) |

(52) U.S. Cl.
CPC ............ *H01L 27/3232* (2013.01); *G02B 1/14* (2015.01); *G02B 5/3016* (2013.01); *G02B 5/3025* (2013.01); *G02B 5/3083* (2013.01); *G02B 27/281* (2013.01); *H01L 51/0097* (2013.01); *H01L 51/5253* (2013.01); *H01L 51/5281* (2013.01); *H01L 51/5293* (2013.01); *H01L 51/56* (2013.01); *G02B 5/30* (2013.01)

(58) Field of Classification Search
None
See application file for complete search history.

(56) References Cited

U.S. PATENT DOCUMENTS

| | | | |
|---|---|---|---|
| 2005/0035353 A1* | 2/2005 | Adachi | .................... H01L 27/12 257/72 |
| 2010/0002298 A1* | 1/2010 | Sugino | ..................... B32B 7/12 359/485.01 |
| 2016/0216424 A1* | 7/2016 | Seo | ....................... G02B 5/3016 |
| 2016/0238766 A1* | 8/2016 | Huang | ................... G02B 5/305 |
| 2017/0052300 A1 | 2/2017 | Takeda et al. | |

FOREIGN PATENT DOCUMENTS

JP 2015-210459 A 11/2015

* cited by examiner

*Primary Examiner* — Minh Loan Tran
(74) *Attorney, Agent, or Firm* — Typha IP LLC

(57) ABSTRACT

An aspect of the present invention is directed to a display device including: an array substrate arranged with a plurality of pixels each having a light-emitting element are arranged; a first resin layer covering the plurality of pixels and having a first surface subjected to an alignment process; polarizers disposed over the first surface and aligned according to the alignment process; and a counter substrate disposed over the first resin layer.

13 Claims, 19 Drawing Sheets

DISPLAY DEVICE AND METHOD OF MANUFACTURING THE SAME

CROSS-REFERENCE TO RELATED APPLICATIONS

This application is based upon and claims the benefit of priority from the prior Japanese Patent Application No. 2016-151166, filed on Aug. 1, 2016, the entire contents of which are incorporated herein by reference.

FIELD

The present invention relates to display devices and, in particular, to a display device having light-emitting elements in pixels.

BACKGROUND

An organic electroluminescence (hereinafter referred to as "organic EL") display device has light-emitting elements corresponding to each separate pixel and displays an image by individually controlling the emission of light. Each of the light-emitting elements includes an anode, a cathode, and a layer containing an organic EL material (hereinafter also referred to as "light-emitting layer"). The light-emitting layer is sandwiched between the anode and the cathode. The injection of electrons into the light-emitting layer through the cathode and the injection of holes into the light-emitting layer through the anode cause the electrons and the holes to recombine with each other. This discharges excess energy that excites luminescent molecules contained in the light-emitting layer, and then the luminescent molecules are deexcited to emit light.

In the organic EL display device, the anode of each of the light-emitting elements is provided as a pixel electrode for each pixel, and the cathodes are provided, for example, across the plurality of pixels as a common electrode to which a common potential is applied. The organic EL display device controls the emission of light from the pixels by applying the potential of the pixel electrode for each pixel with respect to the potential of the common electrode. It should be noted that the configuration in which the cathodes are disposed across the plurality of pixels and a common potential is applied to each of the pixels may be replaced by a configuration in which common potentials are individually applied to each separate pixel.

Note here that, for high efficiency in the extraction of light, it is preferable that the pixel electrodes be made of a metal material having a high reflectivity. However, if outside light enters the organic EL display device and becomes visible by being reflected by the pixel electrodes, the viewability of a display image will be degraded. In order to prevent such outside light reflections, it is necessary to provide the organic EL display device with a circularly polarizing plate.

In general, a polarizing plate is formed by drawing polyvinyl alcohol (PVA) (for example, Japanese Unexamined Patent Application Publication No. 2015-210459).

However, such formation of a polarizing plate by drawing polyvinyl alcohol (PVA) is difficult and poses problems in terms of manufacturing cost.

Further, bendable flexible display devices have recently been under vigorous development. However, depending on its thickness and hardness, a polarizing plate suffers from stress concentration when the display device is bent, with the result that the bent part may get cloudy or cracked.

SUMMARY

An aspect of the present invention is directed to a display device including: an array substrate arranged with a plurality of pixels each having a light-emitting element; a first resin layer covering the plurality of pixels and having a first surface subjected to an alignment process; polarizers disposed over the first surface and aligned according to the alignment process; and a counter substrate disposed above the first resin layer.

An aspect of the present invention is directed to a method of manufacturing a display device, including: preparing an array substrate arranged with a plurality of pixels; forming a first resin layer covering the plurality of pixels; subjecting the first resin layer to an alignment process; and aligning polarizers over the first resin layer.

An aspect of the present invention is directed to a method of manufacturing a display device, including: preparing a counter substrate placed opposite an array substrate, the array substrate being arranged with a plurality of pixels; forming a first resin layer on a side of the counter substrate facing the array substrate; subjecting the first resin layer to an alignment process; aligning polarizers over the first resin layer; and bonding the counter substrate and the array substrate together.

DESCRIPTION OF EMBODIMENTS

Figure 1:
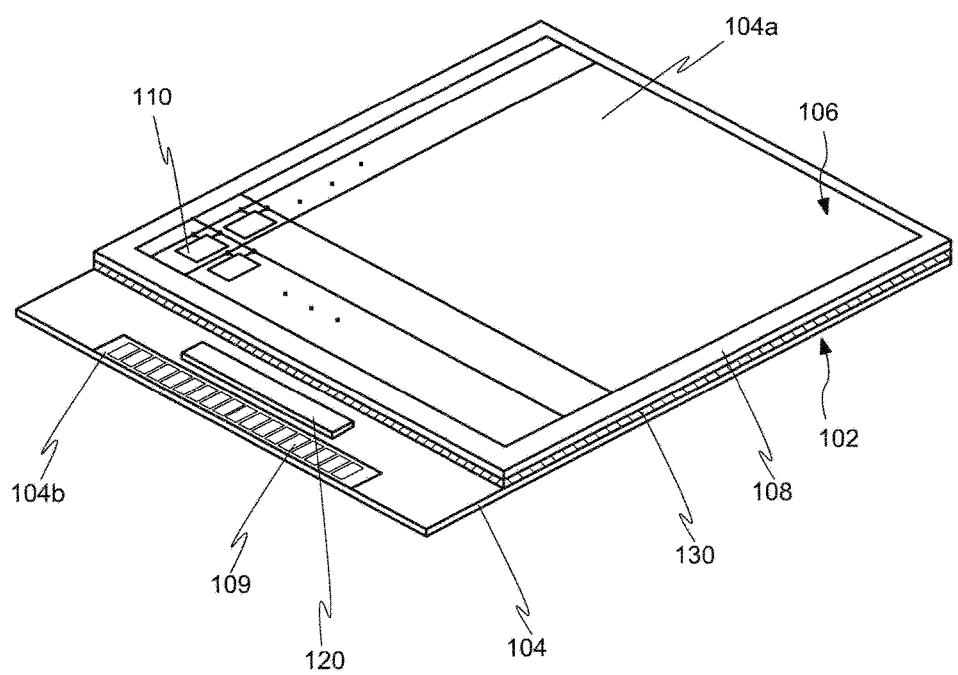
FIG. 1 is a perspective view illustrating an external configuration of a display device according an embodiment of the present invention.

Embodiments of the present invention will be described below with reference to the accompanying drawings and the like. Note, however, that the present invention can be carried out in many different modes and should not be interpreted by only the written contents of embodiments exemplified below. In addition, for the sake of clearer explanation, the drawings sometimes show each portion more schematically than in actual modes in terms of width, thickness, shape, and the like. However, each drawing shows merely an example and should not limit the interpretation of the present invention. Furthermore, in this specification and the drawings, the same reference numerals denote the same elements as those described with reference to preceding drawings, and a detailed description may be appropriately omitted.

In this specification, a case in which a given member or area is located "over (or under)" another member or area includes not only a case in which a given member or area is located immediately above (or immediately below) another member or area but also a case in which a given member or area is located above (or below) another member or area, unless otherwise specified. That is, this case also includes a case in which another constituent element is located above (or below) another member or area so as to be included between a given member or area and another member or area.

First Embodiment

An external configuration of a display device 100 according to a first embodiment, a detailed configuration thereof, and a method of manufacturing the same are described with reference to the drawings. It should be noted that the display device 100 makes it possible to reduce the thickness of the display device 100 as a whole and prevent viewability from deteriorating due to outside light reflections.

[External Configuration]

FIG. 1 is a perspective view illustrating the external configuration of the display device 100 according to the first embodiment. The external configuration of the display device 100 according to the first embodiment is described with reference to FIG. 1.

The display device 100 according to the first embodiment includes an array substrate 102, a counter substrate 106, and a plurality of connection terminals 109.

The array substrate 102 includes at least a first substrate 104 and a plurality of pixels 110.

The first substrate 104 has flexibility. The substrate having flexibility is made of a resin material. A specific material will be described later. A display area 104a and a terminal area 104b are provided over the first substrate 104.

The plurality of pixels 110 are arranged within the display area 104a of the first substrate 104. In the first embodiment, the plurality of pixels 110 are arranged in rows and columns. Although not illustrated in FIG. 1, the plurality of pixels 110 are each constituted by a pixel circuit including at least a selecting transistor, a driving transistor, and a light-emitting element.

The counter substrate 106 includes at least a second substrate 108.

The second substrate 108 has flexibility. Usable examples of the second substrate 108 include a film substrate and a sealing substrate coated with resin or the like. The second substrate 108 is provided on an upper surface of the display area 104a so as to face the first substrate 104. The second substrate 108 is fixed to the first substrate 104 by a sealant 130 surrounding the display area 104a. The display area 104a disposed on the first substrate 104 is sealed with the second substrate 108 and the sealant 130 so as not to be open to the atmosphere. Such a sealing structure prevents the light-emitting element of each of the plurality of pixels 110 from deteriorating. It should be noted that the sealant 130 is not necessarily needed in a case where the second substrate 108 is fixed to the first substrate 104 in another way instead of being fixed to the first substrate 104 by the sealant 130 surrounding the display area 104a.

The plurality of connection terminals 109 are provided within the terminal area 104b. The plurality of connection terminals 109 are disposed at one end of the first substrate 104 and outside of the second substrate 108. A wiring substrate (not illustrated) is disposed which connects the display device 100 to a device that outputs video signals, a power source, and the like at the plurality of connection terminals 109. The plurality of connection terminals 109 have exposed contacts connected to the wiring substrate.

The foregoing has described the external configuration of the display device 100 according to the first embodiment. The following describes the detailed configuration of the display device 100 according to the first embodiment with reference to the drawings.

[Detailed Configuration]

Figure 2:
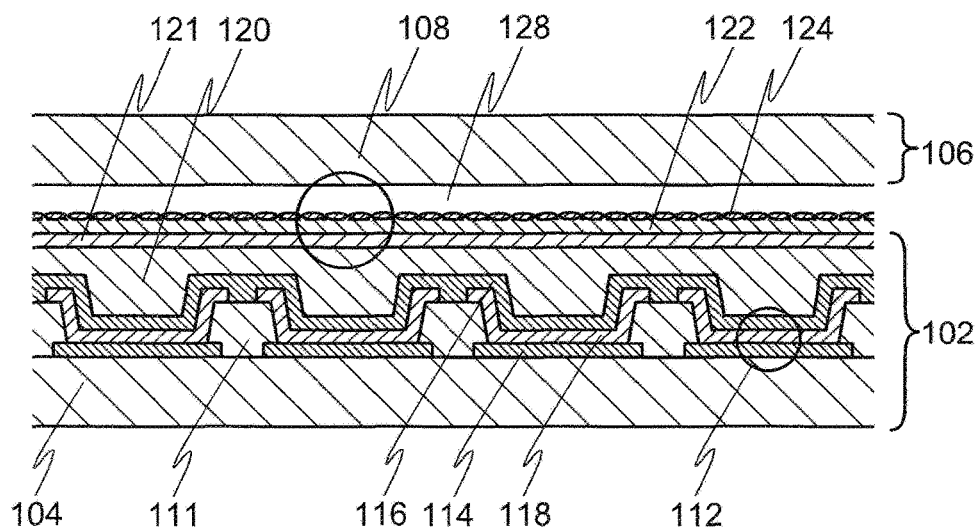
FIG. 2 is a cross-sectional view illustrating a configuration of a display device according to an embodiment of the present invention.
Figure 2:
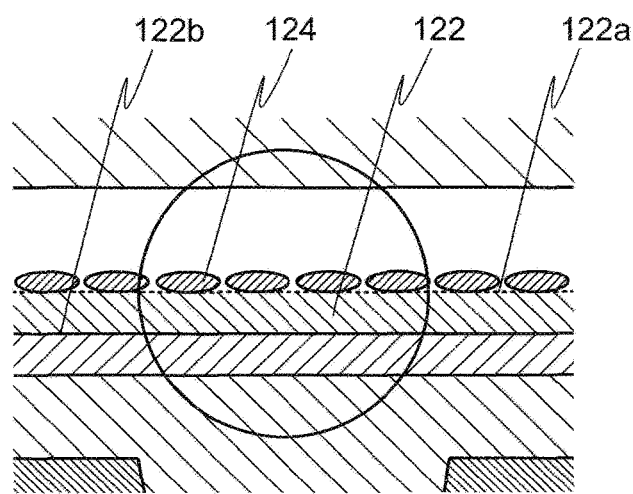

FIG. 2 is a cross-sectional view illustrating a configuration of the display device 100 according to the first embodiment. The configuration of the display device 100 according to the first embodiment is described in more detail with reference to FIG. 2.

The display device 100 according to the first embodiment includes the array substrate 102, a first resin layer 122, polarizers 124, and the counter substrate 106.

The array substrate 102 includes the first substrate 104, the plurality of pixels 110, and a sealing layer 120.

In the first embodiment, a substrate having flexibility is used as the first substrate 104. The substrate having flexibility is made of a resin material. A high-molecular material containing an imide bond in a repeating unit is preferably used as the resin material. For example, polyimide is used. Specifically, a film substrate obtained by molding polyimide into a sheet is used as the first substrate 104. This allows the array substrate 102 to have flexibility as a whole.

The plurality of pixels 110 are arranged in the display area 104a over the first substrate 104 (see FIG. 1). Each of the plurality of pixels 110 is constituted by a pixel circuit including at least a selecting transistor, a driving transistor, and a light-emitting element 112.

A usable example of the light-emitting element 112 is an organic EL light-emitting element. The organic EL light-emitting element includes a pixel electrode 114, a common electrode 116, and a light-emitting layer 118.

The pixel electrode 114 is disposed for each of the plurality of pixels 110. It is preferable that the pixel electrode 114 be made of a material including a high-reflectivity metal layer so that light emitted by the light-emitting layer 118 is reflected toward the common electrode 116. The high-reflectivity metal layer can be made, for example, of silver (Ag).

Furthermore, a transparent conductive layer may be stacked in addition to the aforementioned high-reflectivity metal layer. It is preferable that the transparent conductive layer be made of ITO (indium tin oxide), IZO (indium zinc oxide), or any combination thereof, as these materials have both transparency and electrical conductivity.

The common electrode 116 is disposed across the plurality of pixels 110. It is preferable that, in order to allow passage of the light emitted by the light-emitting layer 118, the common electrode 116 be made of ITO (indium tin oxide), IZO (indium zinc oxide) or the like, as these materials have both transparency and electrical conductivity. Alternatively, the common electrode 116 may be made of a metal layer having such a film thickness as to allow passage of the emitted light.

The light-emitting layer 118 is sandwiched between the pixel electrode 114 and the common electrode 116. The light-emitting layer 118 is made of an organic EL material that emits light when supplied with an electrical current. As the organic EL material, a low-molecular or high-molecular organic material can be used. In a case where the low-molecular organic material is used, the light-emitting layer 118 includes a hole-injection layer, an electron-injection layer, a hole transport layer, an electron transport layer, and the like in addition to the luminescent organic material so that the luminescent organic material is sandwiched therebetween.

Between two adjacent pixels 110, a bank 111 is provided. The bank 111 is provided so as to cover the outer edge of the pixel electrode 114.

It is preferable that the bank 111 be made of an insulating material. An inorganic insulating material or an organic insulating material can be used as the insulating material. Usable examples of the inorganic insulating material include silicon oxide, silicon nitride, and a combination thereof. Usable examples of the organic insulating material include polyimide resin, acrylic resin, and a combination thereof. The inorganic insulating material and the organic insulating material may be used in combination.

The disposition of the bank 111 made of an insulating material makes it possible to prevent the common electrode 116 and the pixel electrode 114 from being short-circuited at the end of the pixel electrode 114 and, furthermore, makes it possible to surely insulate the adjacent pixels 110 from each other.

The sealing layer 120 is disposed across at least the display area 104a and covers the plurality of pixels 110. The sealing layer 120 can be made of an insulating material. As the insulating material, an inorganic insulating material or an organic insulating material can be used.

Usable examples of the inorganic insulating material include silicon oxide (SiOx), silicon nitride (SiNx), silicon oxynitride (SiOxNy), silicon nitroxide (SiNxOy), aluminum oxide (AlOx), aluminum nitride (AlNx), aluminum oxynitride (AlOxNy), and aluminum nitroxide (AlNxOy) (x and y are arbitrary).

Usable examples of the organic insulating material include polyimide resin and acrylic resin.

The sealing layer 120 may be constituted by a first inorganic insulating layer, a first organic insulating layer, and a second inorganic insulating layer being stacked in this order from the side of the array substrate 102.

It is preferable that the first inorganic insulating layer be made of an insulating material that can block entry of moisture. A usable example of the material of which the first inorganic insulating layer is made is silicon nitride.

It is preferable that the first organic insulating layer be made of an insulating material that can planarize asperities attributed to the plurality of light-emitting elements 112, the bank 111, and the like disposed thereunder. The presence of such asperities may undermine the coatability of the first inorganic insulating layer to generate a pathway of propagation of moisture in the first inorganic insulating layer. A usable example of the material of which the first organic insulating layer is made is acrylic resin.

It is preferable that the second inorganic insulating layer be made of an insulating material that can block entry of moisture. Since an organic insulating material easily makes a pathway of entry of moisture, moisture having entered the first organic insulating layer may undesirably reach the first inorganic insulating layer and further enter the light-emitting layer 118. Since the first organic insulating layer, made of acrylic resin, has high flatness, the second inorganic insulating layer is excellent in coatability. This makes it hard to generate a pathway of propagation of moisture. A usable example of the material of which the second inorganic insulating layer is made is silicon nitride.

Having the sealing layer 120 thus configured makes it possible to provide the display device 100 with excellent resistance to entry of moisture.

A retardation film 121 is disposed over the sealing layer 120. Further, the retardation film 121 needs to be disposed under the polarizers 124. The retardation film 121 is made of a birefringent material or the like. Incidence of linearly polarized light on the retardation film 121 makes a phase difference between two orthogonal polarization components. In the first embodiment, a quarter-wavelength retardation film is used as the retardation film 121. The quarter-wavelength retardation film can give a quarter-wavelength (90 degrees) phase difference between the two orthogonal polarization components and convert the linearly polarized light into circularly polarized light. It should be noted that the display device 100 does not necessarily require the retardation film 121 and may be configured without using the retardation film 121. In that case, the retardation film 121 shown in FIG. 2 is eliminated, and the sealing layer 120 and the after-mentioned first resin layer 122 come into direct contact with each other.

The first resin layer 122 covers the plurality of pixels 110. The first resin layer 122 has a first surface 122a and a second surface 122b with an alignment process applied to at least the first surface 122a. The alignment process is a process for aligning the after-mentioned polarizers 124 in a given direction, and the first surface 122a has for example grooves formed therein in a given direction. In the first embodiment, the first resin layer 122 is disposed on the side of the array substrate 102. The first surface 122a is a surface of the first resin layer 122 that faces the counter substrate 106.

The polarizers 124 are disposed over the first surface 122a of the first resin layer 122. The polarizers 124 are aligned according to the alignment process applied to the first surface 122a of the first resin layer 122. That is, the polarizers 124 are aligned along the direction of the grooves formed in the first surface 122a of the first resin layer 122.

A usable example of the polarizers 124 is liquid crystal molecules. Either low-molecular liquid crystals or high-molecular liquid crystals can be used as the liquid crystal molecules. Specific usable examples of liquid crystal materials include nematic liquid crystals, smectic liquid crystals, cholesteric liquid crystals, discotic liquid crystals, or the like.

The counter substrate 106 includes at least the second substrate 108. The counter substrate 106 may further include a color filter disposed in a position corresponding to each of the plurality of pixels 110 and a light-blocking layer (also called "black matrix") disposed in a position defining each of the plurality of pixels 110.

The second substrate 108 is disposed to cover the first resin layer 122. The second substrate 108 has flexibility. Usable examples of the second substrate 108 include a film substrate and a sealing substrate coated with resin or the like. The second substrate 108 can be made of a material which is similar to that of which the aforementioned first substrate 104 is made.

A space between the array substrate 102 and the counter substrate 106 is filled with a filler 128. As the filler 128, a UV-curing or thermosetting organic adhesive can be used. Specific usable examples of materials include acrylic resin and epoxy resin.

The foregoing has described the configuration of the display device 100 according to the first embodiment. The display device 100 according to the first embodiment includes the first resin layer 122 and the polarizers 124. The first resin layer 122, subjected to the alignment process, has a function of causing the polarizers 124 over the first resin layer 122 to be aligned in a given direction. Since the first resin layer 122 and the polarizers 124 serve as a polarizing plate, the need for a conventional polarizing plate formed by drawing polyvinyl alcohol is eliminated.

This allows the display device 100 according to the first embodiment to be thinner as a whole and more flexible than a display device including a conventional polarizing plate. This allows the display device 100 to be more resistant to cracking when it is bent, thus making it possible to provide the display device 100 with improved reliability.

Next, a method of manufacturing a display device 100 according to the first embodiment is described with reference to the drawings.

[Manufacturing Method]

FIGS. 3A to 3E are cross-sectional views illustrating a method of manufacturing a display device 100 according to the first embodiment. The method of manufacturing a display device 100 according to the first embodiment is described in detail with reference to FIGS. 3A to 3E. The method of manufacturing a display device 100 according to the first embodiment includes the following steps.

Figure 3A:
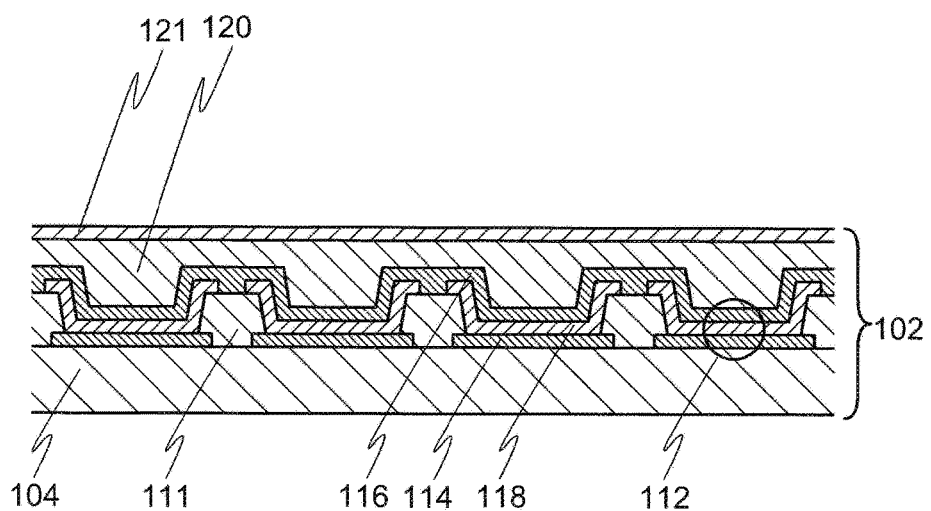
FIG. 3A is a cross-sectional view illustrating a method of manufacturing a display device according to an embodiment of the present invention.

First, an array substrate 102 having a plurality of pixels 110 arranged on a first substrate 104 is prepared, and a retardation film 121 is formed over the array substrate 102 (FIG. 3A). It should be noted that the retardation film does not necessarily need to be formed in this case.

The first substrate 104 is a flexible substrate formed by molding polyimide resin or the like into a sheet over a support substrate such as a glass substrate. Therefore, the array substrate 102 has flexibility as a whole. The plurality of pixels 110 are formed over the first substrate 104. The retardation film 121 can be made of a birefringent material or the like. A usable example of the birefringent material is polycarbonate. It should be noted that the retardation film does not necessarily need to be formed in this case.

Figure 3B:
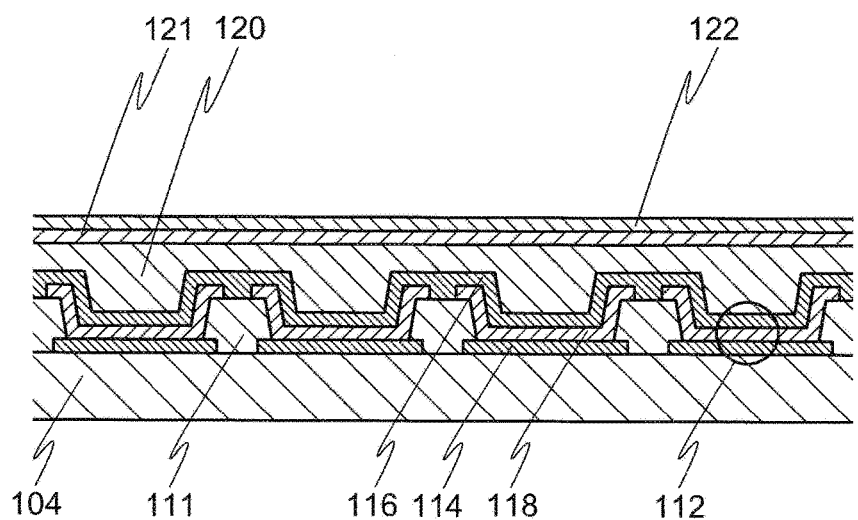
FIG. 3B is a cross-sectional view illustrating a method of manufacturing a display device according to an embodiment of the present invention.

Next, a first resin layer 122 covering the plurality of pixels 110 is formed (FIG. 3B). As a material of which the first resin layer 122 is made, organic resin can be used. A usable example of the organic resin is polyimide resin.

Usable examples of a method of forming the first resin layer 122 include a printing method and a coating method. As the printing method, a method for forming an alignment layer in a convention liquid crystal display device may be used. Usable examples of the coating method include an inkjet method.

Figure 3C:
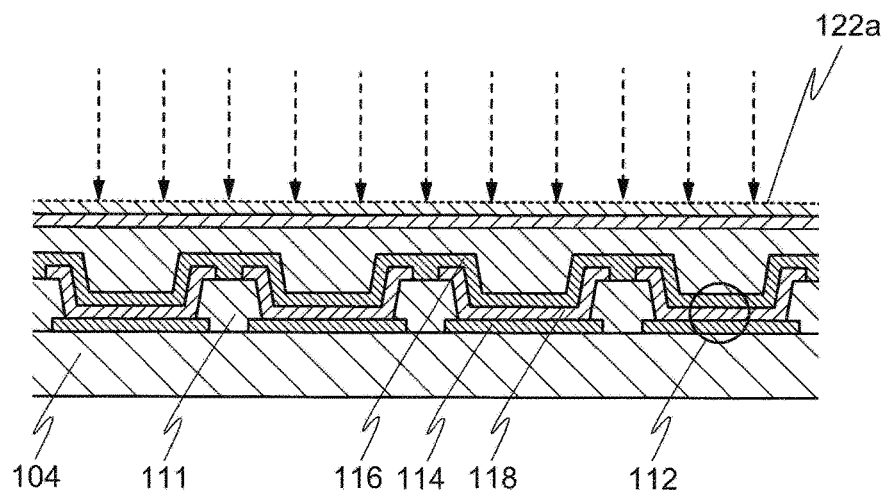
FIG. 3C is a cross-sectional view illustrating a method of manufacturing a display device according to an embodiment of the present invention.

Next, the first resin layer 122 is subjected to an alignment process (FIG. 3C). As the alignment process, a mechanical process such as a rubbing process or a chemical process such as a photo-alignment process can be used. FIG. 3C shows an aspect in which the photo-alignment process is applied.

In the rubbing process, a first surface 122a, which is an exposed surface of the first resin layer 122, is rubbed in a given direction by rotating a roller while pressing the roller at a given pressure against the substrate coated with the first resin layer 122, with a cloth such as a nylon cloth wound around the roller.

In the photo-alignment process, the first surface 122a, which is an exposed surface of the first resin layer 122, is irradiated with radiation such as linearly polarized ultraviolet rays. This induces a selective reaction between macromolecular chains in the first resin layer 122 that are aligned in the direction of polarization, thereby generating anisotropy and imparting an alignment function. This method is preferable because it is a non-contact process of irradiation with ultraviolet rays or the like and, as such, hardly causes damage to the plurality of pixels 110 arranged under the first resin layer 122.

Figure 3D:
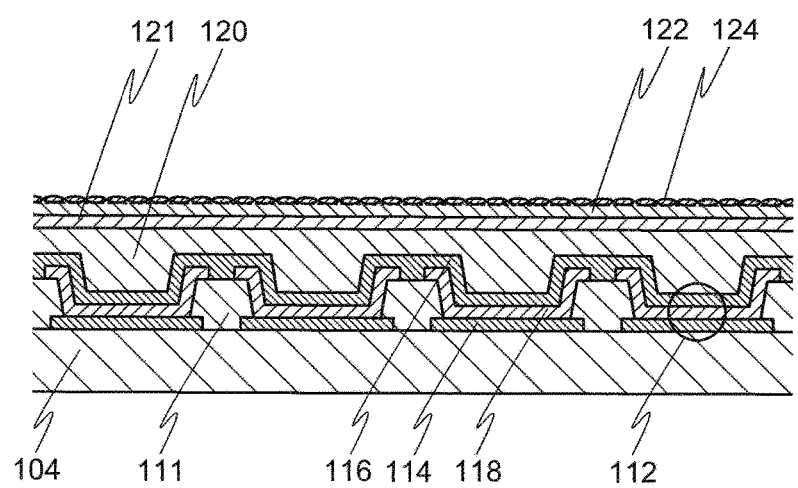
FIG. 3D is a cross-sectional view illustrating a method of manufacturing a display device according to an embodiment of the present invention.

Next, polarizers 124 are arranged over the first resin layer 122 (FIG. 3D). The polarizers 124 are for example liquid crystal molecules. The liquid crystal molecules are arranged by first applying a coating of liquid crystal material onto the first surface 122a of the first resin layer 122. With the alignment process applied to the first surface 122a of the first resin layer 122, the liquid crystal molecules in the coating of liquid crystal material spontaneously align themselves according to the alignment process. Specifically, the group of liquid crystal molecules spontaneously align themselves so that their major axis extend in a direction corresponding to the alignment process.

Figure 3E:
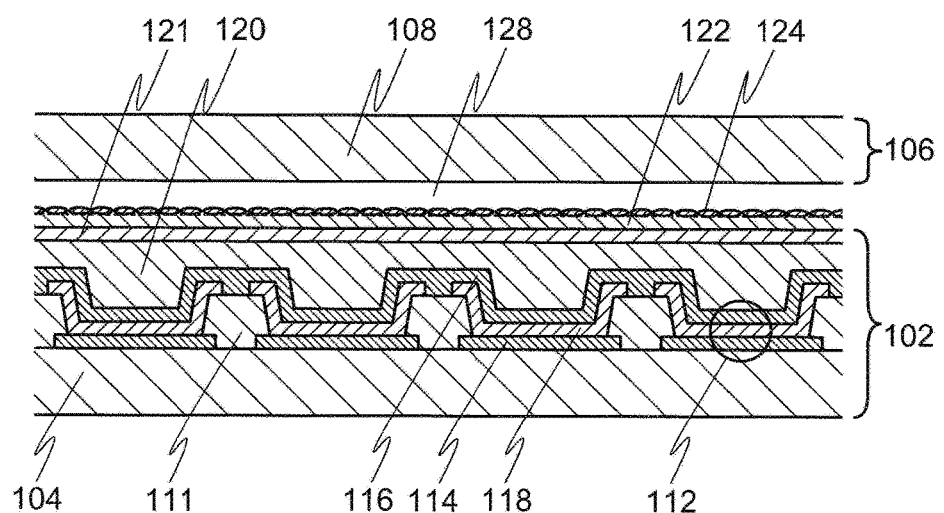
FIG. 3E is a cross-sectional view illustrating a method of manufacturing a display device according to an embodiment of the present invention.

Next, the array substrate 102 is bonded to a counter substrate 106, whereby a display device 100 according to the first embodiment can be obtained (FIG. 3E).

The foregoing has described the method of manufacturing a display device 100 according to the first embodiment. The method of manufacturing a display device 100 according to the first embodiment does not include the step of forming a conventional polarizing plate. Specifically, it does not include the step of drawing in order to impart polarization performance to polyvinyl alcohol (PVA). Such formation of a polarizing plate by drawing is difficult and has posed problems in terms of manufacturing cost.

The method of manufacturing a display device 100 according to the first embodiment includes the step of forming the first resin layer 122 and the polarizers 124 instead of including the step of forming a conventional polarizing plate. This makes the manufacturing process easier than before and makes it possible to lower manufacturing costs.

Second Embodiment

A detailed configuration of a display device 200 according to a second embodiment and a method of manufacturing the same are described with reference to the drawings.
[Detailed Configuration]

A detailed description is given with a focus on points of difference, with the omission of a description of components that are identical to those of the display device 100 according to the first embodiment.

Figure 4:
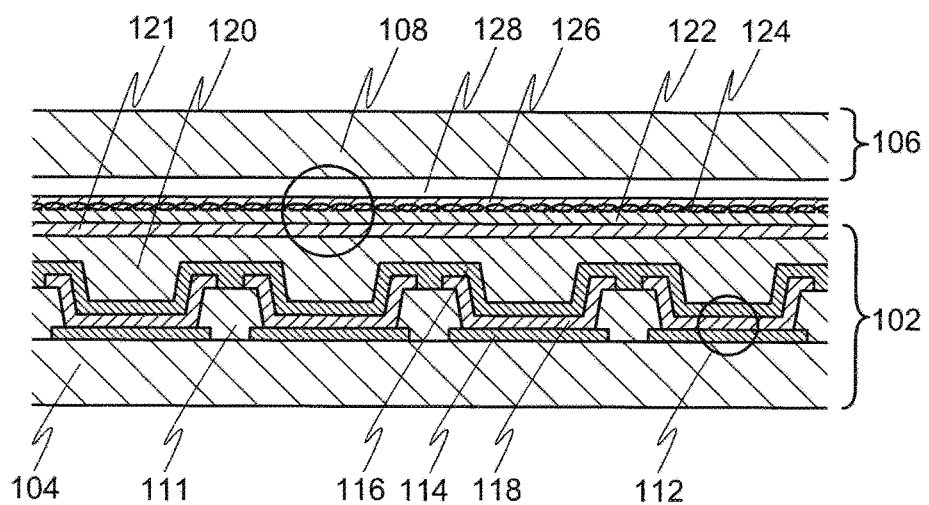
FIG. 4 is a cross-sectional view illustrating a configuration of a display device according to an embodiment of the present invention.
Figure 4:
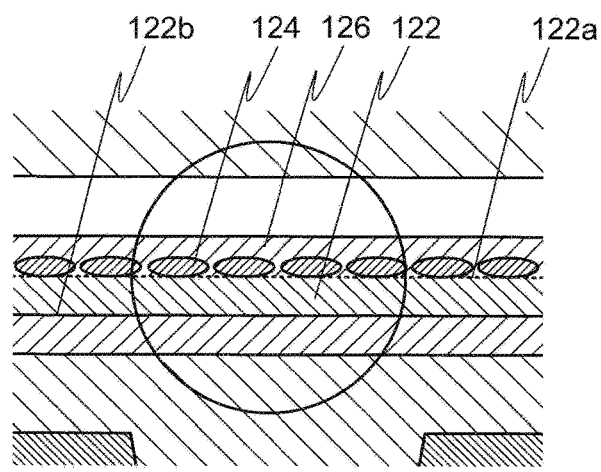

The display device 200 according to the second embodiment differs from the display device 100 according to the first embodiment in that a protective layer 126 is provided over the first resin layer 122. That is, the protective layer 126 is disposed over the first surface 122a of the first resin layer 122 (FIG. 4).

The protective layer 126 serves to fix the polarizers 124 arranged over the first resin layer 122. The protective layer 126 can be made of an organic material. Acrylic resin can be used as organic resin.

Having the protective layer 126 improves adhesion between the liquid crystal molecules and the first resin layer 122. This makes it possible to prevent the liquid crystal molecules from being disarranged when the display device 200 is bent. This makes it possible to provide the display device 200 with viewability that hardly deteriorates due to bending.

The foregoing has described the configuration of the display device 200 according to the second embodiment. The display device 200 according to the second embodiment includes the first resin layer 122, the polarizers 124, and the protective layer 126. The first resin layer 122, subjected to the alignment process, has a function of causing the polarizers 124 over the first resin layer 122 to be aligned in a given direction. Since the polarizers 124 are fixed by the protective layer 126 at this time and the first resin layer 122 and the polarizers 124 serve as a polarizing plate, the need for a conventional polarizing plate formed by drawing polyvinyl alcohol is eliminated.

This allows the display device 200 according to the second embodiment to be thinner as a whole and more flexible than a display device including a conventional polarizing plate. This allows the display device 200 to be more resistant to cracking when it is bent, thus making it possible to provide the display device 200 with improved reliability.

Next, a method of manufacturing a display device 200 according to the second embodiment is described with reference to the drawings. Only a method of manufacturing a protective layer is described here, as the method of manufacturing a display device 200 according to the second embodiment is the same as the method of manufacturing a display device 100 according to the first embodiment except for the method of manufacturing a protective layer.
[Protective Layer Manufacturing Method]

Figure 5A:
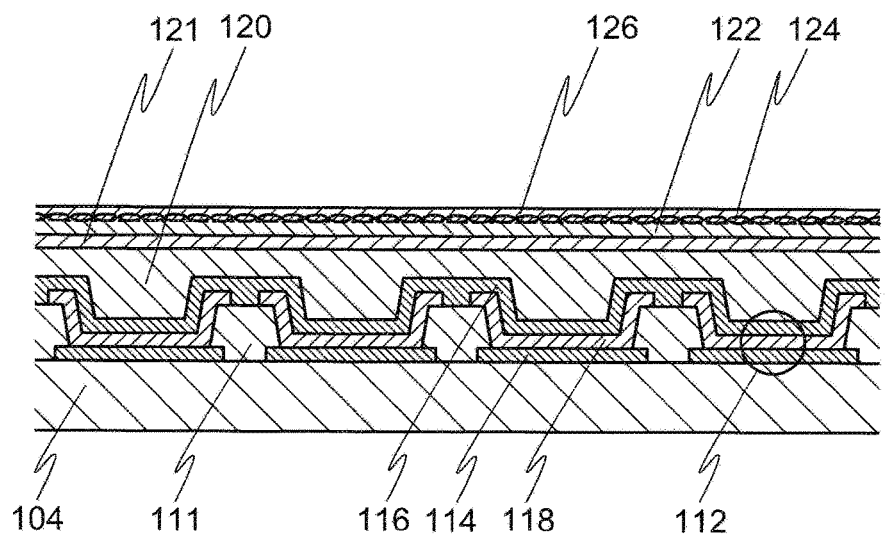
FIG. 5A is a cross-sectional view illustrating a method of manufacturing a display device according to an embodiment of the present invention.
Figure 5B:
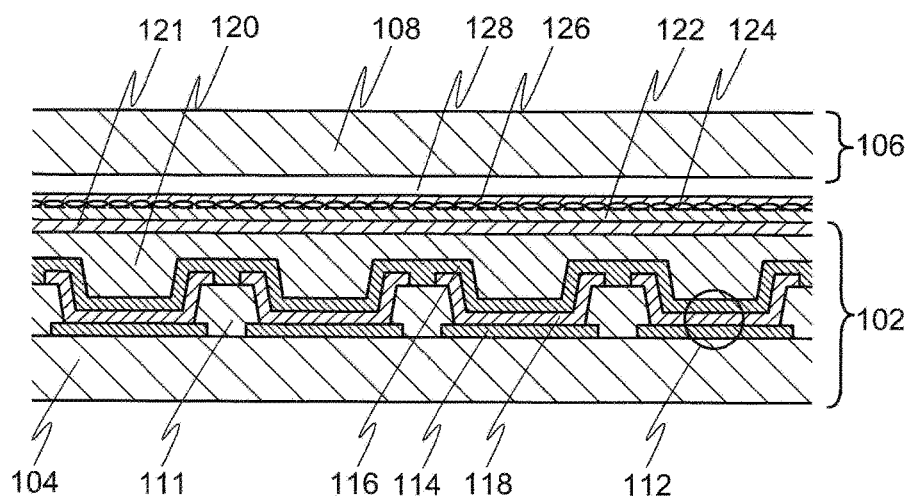
FIG. 5B is a cross-sectional view illustrating a method of manufacturing a display device according to an embodiment of the present invention.

FIGS. 5A and 5B are cross-sectional views illustrating a method of manufacturing a display device 200 according to the second embodiment. Of the method of manufacturing a display device 200 according to the second embodiment, a method of manufacturing a protective layer 126 is described with reference to FIGS. 5A and 5B. It should be noted that the steps preceding the formation of the protective layer 126 are the same as those of the method of manufacturing a display device 100 according to the aforementioned first embodiment.

After the polarizers 124 have been arranged over the first resin layer 122 (FIG. 3D), the protective layer 126 is formed over the first resin layer 122 (FIG. 5A). As a material of which the protective layer 126 is made, organic resin can be used. An organic resin layer can be made, for example, of acrylic resin.

It should be noted that although the second embodiment shows an aspect in which the polarizers 124 are completely buried in the protective layer 126, this does imply any limitation. An alternative configuration may be one in which the polarizers 124 are partially buried in the protective layer 126.

Usable examples of a method of forming the protective layer 126 include an evaporation method and a coating method. A so-called flash evaporation method is preferable as the evaporation method. The flash evaporation method is a type of evaporation method in which a particulate evaporation material is supplied in small amounts into a crucible and a film-forming material is instantaneously evaporated.

Usable examples of the coating method include an inkjet method.

Next, the array substrate 102 is bonded to a counter substrate 106, whereby a display device 200 according to the second embodiment can be obtained (FIG. 5B).

Third Embodiment

A detailed configuration of a display device 300 according to a third embodiment and a method of manufacturing the same are described with reference to the drawings.
[Detailed Configuration]

Figure 6:
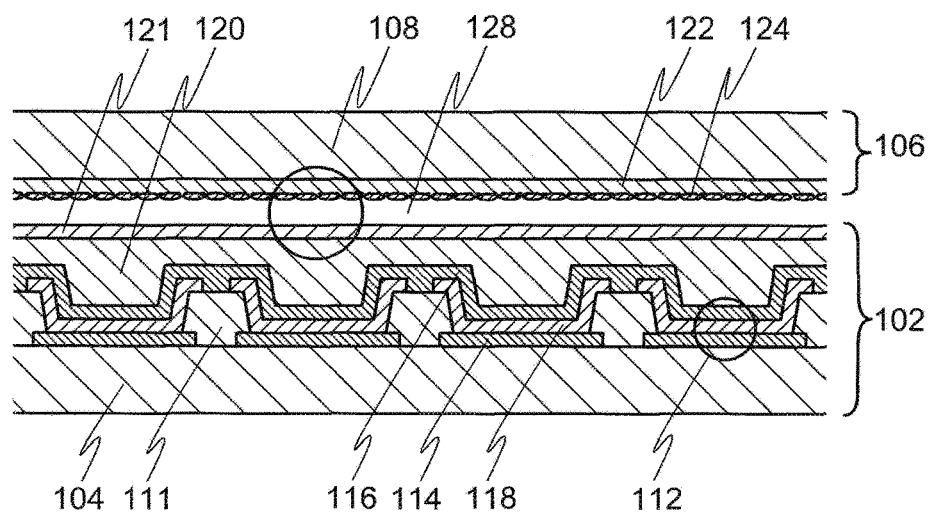
FIG. 6 is a cross-sectional view illustrating a configuration of a display device according to an embodiment of the present invention.
Figure 6:
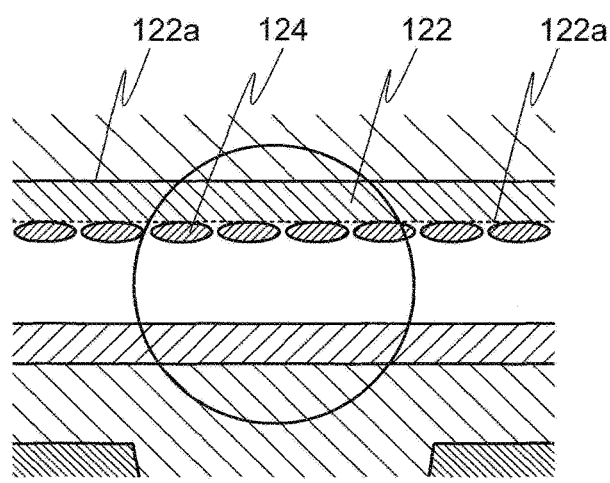

FIG. 6 is a cross-sectional view illustrating a configuration of the display device 300 according to the third embodiment. The configuration of the display device 300 according to the third embodiment is described with reference to FIG. 6. It should be noted that a detailed description is given with a focus on points of difference, with a possible omission of a description of components that are identical to those of the display device 100 according to the first embodiment.

The display device 300 according to the third embodiment differs from the display device 100 according to the first embodiment in terms of the configuration of the first resin layer 122 and the polarizers 124. That is, the display device 300 according to the third embodiment differs from the display device 100 according to the first embodiment in that the first resin layer 122 subjected to the alignment process is disposed on the side of the counter substrate 106. At this time, the first surface 122a is a surface of the first resin layer 122 that faces the array substrate 102. The polarizers 124 are disposed over the first surface 122a of the first resin layer 122.

In other words, the counter substrate 106 includes the second substrate 108, the first resin layer 122, and the polarizers 124.

The first resin layer 122 is disposed on a side of the second substrate 108 that faces the array substrate 102. The first resin layer 122 has the first surface 122a and the second surface 122b with the alignment process applied to at least the first surface 122a. As mentioned above, in the third embodiment, the first resin layer 122 is disposed on the side of the counter substrate 106. The first surface 122a is a surface of the first resin layer 122 that faces the array substrate 102.

The polarizers 124 are disposed over the first surface 122*a* of the first resin layer 122. The polarizers 124 are aligned according to the alignment process applied to the first surface 122*a* of the first resin layer 122. That is, the polarizers 124 are aligned along the direction of the grooves formed in the first surface 122*a* of the first resin layer 122.

The space between the array substrate 102 and the counter substrate 106 is filled with the filler 128. Therefore, the first resin layer 122 and the polarizers 124 are disposed closer to the counter substrate 106 than the filler 128.

[Manufacturing Method]

FIGS. 7A to 7E are cross-sectional views illustrating a method of manufacturing a display device 300 according to the third embodiment. The method of manufacturing a display device 300 according to the third embodiment is described in detail with reference to FIGS. 7A to 7E. The method of manufacturing a display device 300 according to the third embodiment includes the following steps.

Figure 7A:
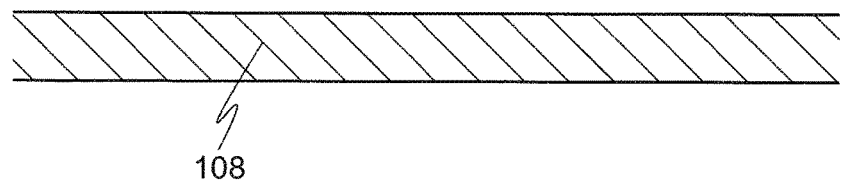
FIG. 7A is a cross-sectional view illustrating a method of manufacturing a display device according to an embodiment of the present invention.

First, a second substrate 108 for manufacturing a counter substrate 106 is prepared (FIG. 7A). In a subsequent manufacturing step, the counter substrate 106 is placed opposite an array substrate 102 in which a plurality of pixels 110 are arranged.

Figure 7B:
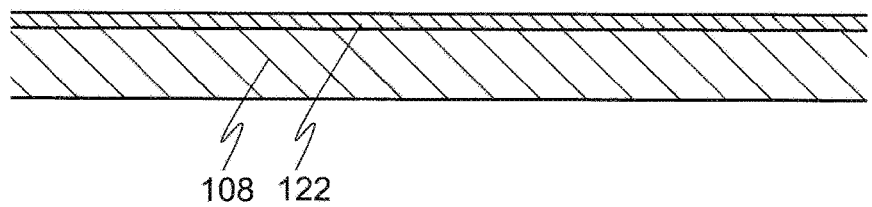
FIG. 7B is a cross-sectional view illustrating a method of manufacturing a display device according to an embodiment of the present invention.

Next, a first resin layer 122 is formed on a side of the second substrate 108 that faces the array substrate 102 (FIG. 7B). Organic resin can be used as a material of which the first resin layer 122 is made. A usable example of the organic resin is polyimide resin.

Usable examples of a method of forming the first resin layer 122 include a printing method and a coating method. As the printing method, a method for forming an alignment layer in a convention liquid crystal display device may be used. Usable examples of the coating method include an inkjet method.

Figure 7C:
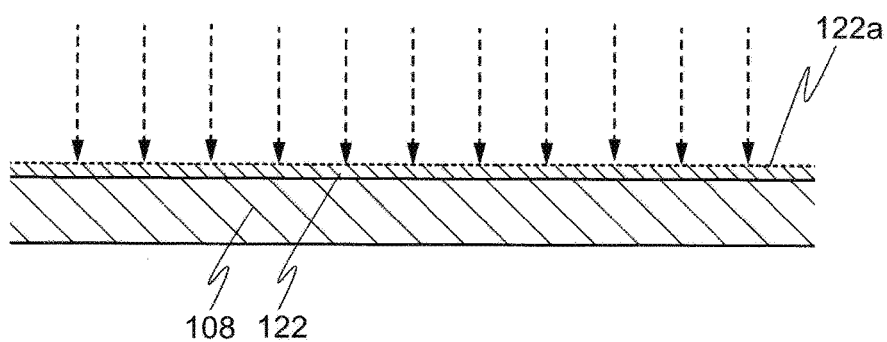
FIG. 7C is a cross-sectional view illustrating a method of manufacturing a display device according to an embodiment of the present invention.

Next, the first resin layer 122 is subjected to an alignment process (FIG. 7C). A mechanical process such as a rubbing process or a chemical process such as a photo-alignment process can be used as the alignment process. FIG. 7C shows an aspect in which the photo-alignment process is applied.

Figure 7D:
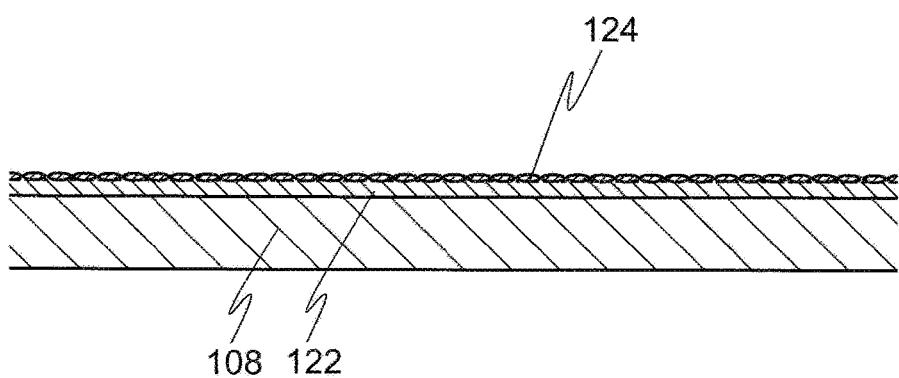
FIG. 7D is a cross-sectional view illustrating a method of manufacturing a display device according to an embodiment of the present invention.

Next, polarizers 124 are arranged over the first resin layer 122 (FIG. 7D). The polarizers 124 are for example liquid crystal molecules. The liquid crystal molecules are arranged by first applying a coating of liquid crystal material onto the first surface 122*a* of the first resin layer 122. With the alignment process applied to the first surface 122*a* of the first resin layer 122, the liquid crystal molecules in the coating of liquid crystal material spontaneously align themselves according to the alignment process. Specifically, the group of liquid crystal molecules spontaneously align themselves so that their major axis extend in a direction corresponding to the alignment process.

Figure 7E:
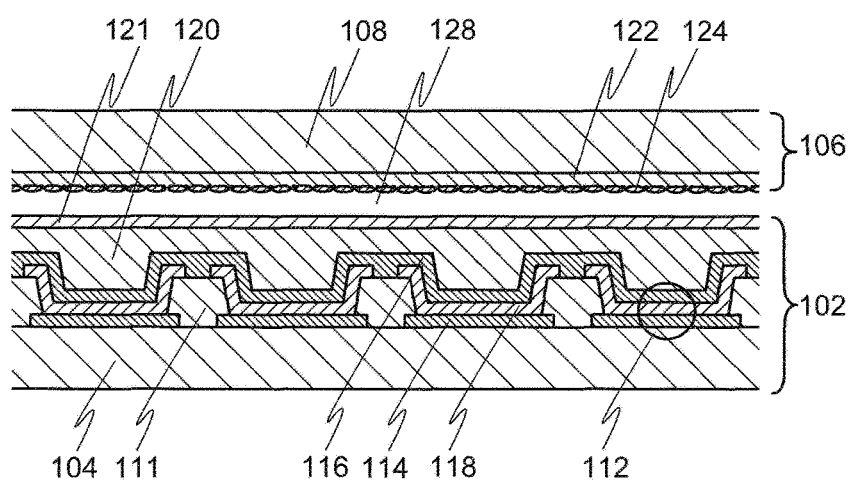
FIG. 7E is a cross-sectional view illustrating a method of manufacturing a display device according to an embodiment of the present invention.

Next, the array substrate 102 is bonded to the counter substrate 106 (FIG. 7E). Through these steps, a display device 300 according to the third embodiment can be obtained.

Fourth Embodiment

An external configuration of a display device 400 according to a fourth embodiment, a detailed configuration thereof, and a method of manufacturing the same are described with reference to the drawings.

[Detailed Configuration]

A detailed description is given with a focus on points of difference, with the omission of a description of components that are identical to those of the display device 300 according to the third embodiment.

Figure 8:
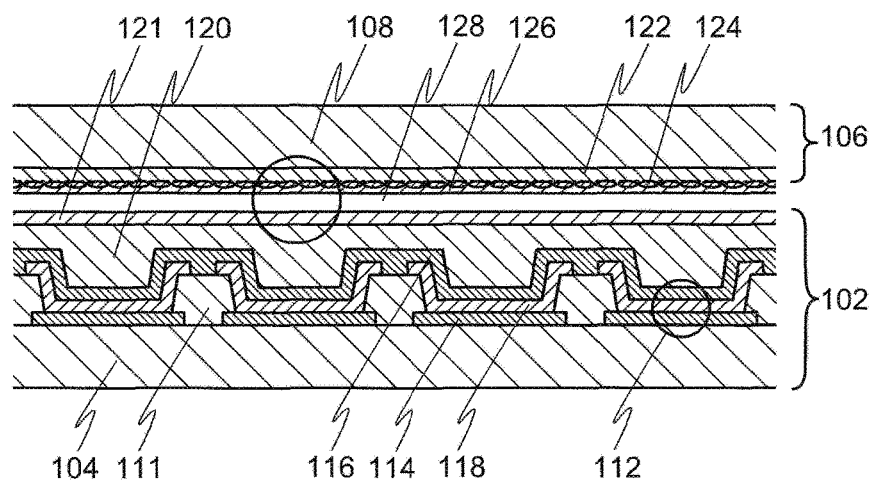
FIG. 8 is a cross-sectional view illustrating a configuration of a display device according to an embodiment of the present invention.
Figure 8:
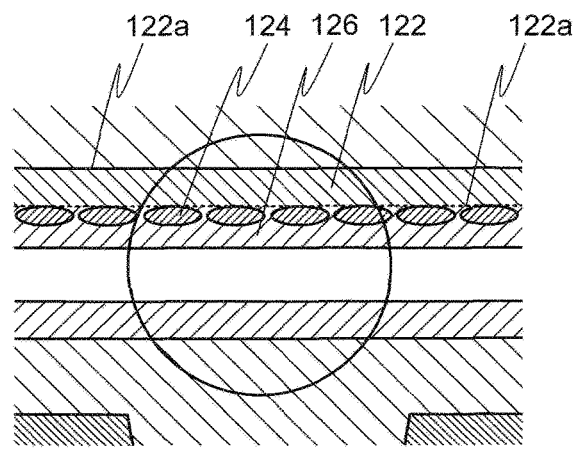

The display device 400 according to the fourth embodiment differs from the display device 300 according to the third embodiment in that a protective layer 126 is provided over the first resin layer 122 (FIG. 8).

The protective layer 126 serves to fix the polarizers 124 arranged over the first resin layer 122. The protective layer 126 can be made of an organic material. Acrylic resin can be used as organic resin.

Having the protective layer 126 improves adhesion between the liquid crystal molecules and the first resin layer 122. This makes it possible to prevent the liquid crystal molecules from being disarranged when the display device 400 is bent. This makes it possible to provide the display device 400 with viewability that hardly deteriorates due to bending.

The foregoing has described the configuration of the display device 400 according to the fourth embodiment. The display device 400 according to the fourth embodiment includes the first resin layer 122, the polarizers 124, and the protective layer 126. The first resin layer 122, subjected to the alignment process, has a function of causing the polarizers 124 on the first resin layer 122 to be aligned in a given direction. Since the polarizers 124 are fixed by the protective layer 126 at this time and the first resin layer 122 and the polarizers 124 serve as a polarizing plate, the need for a conventional polarizing plate formed by drawing polyvinyl alcohol is eliminated.

This allows the display device 400 according to the fourth embodiment to be thinner as a whole and more flexible than a display device including a conventional polarizing plate. This allows the display device 400 to be more resistant to cracking when it is bent, thus making it possible to provide the display device 400 with improved reliability.

Next, a method of manufacturing a display device 400 according to the fourth embodiment is described with reference to the drawings. Only a method of manufacturing a protective layer is described here, as the method of manufacturing a display device 400 according to the fourth embodiment is the same as the method of manufacturing a display device 100 according to the first embodiment except for the method of manufacturing a protective layer.

[Protective Layer Manufacturing Method]

Figure 9A:
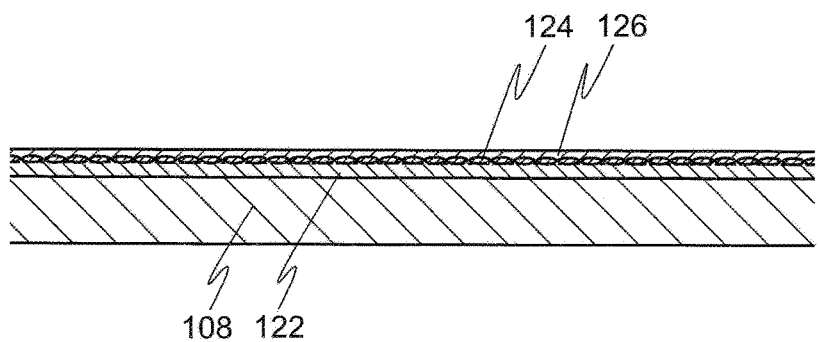
FIG. 9A is a cross-sectional view illustrating a method of manufacturing a display device according to an embodiment of the present invention.
Figure 9B:
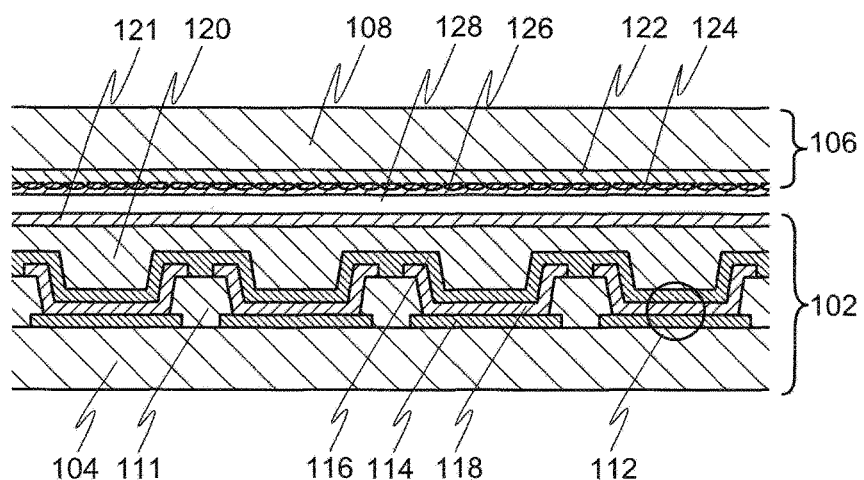
FIG. 9B is a cross-sectional view illustrating a method of manufacturing a display device according to an embodiment of the present invention.

FIGS. 9A and 9B are cross-sectional views illustrating a method of manufacturing a display device 400 according to the fourth embodiment. Of the method of manufacturing a display device 400 according to the fourth embodiment, a method of manufacturing a protective layer is described with reference to FIGS. 9A and 9B. It should be noted that the steps preceding the formation of the protective layer are the same as those of the method of manufacturing a display device 300 according to the aforementioned third embodiment.

After the polarizers 124 have been arranged over the first resin layer 122 (FIG. 7D), the protective layer 126 is formed over the first resin layer 122 (FIG. 9A). A usable example of a material of which the protective layer 126 is organic resin. A usable example of an organic resin layer is acrylic resin.

It should be noted that although the second embodiment shows an aspect in which the polarizers 124 are completely buried in the protective layer 126, this does imply any limitation. An alternative configuration may be one in which the polarizers 124 are partially buried in the protective layer 126.

Usable examples of a method of forming the protective layer 126 include an evaporation method and a coating method. A so-called flash evaporation method is preferable as the evaporation method. The flash evaporation method is a type of evaporation method in which a particulate evaporation material is supplied in small amounts into a crucible and a film-forming material is instantaneously evaporated.

Usable examples of the coating method include an inkjet method.

Next, the array substrate 102 is bonded to a counter substrate 106, whereby a display device 400 according to the fourth embodiment can be obtained (FIG. 9B).

The foregoing has described preferred aspects of the present invention with reference to the first to fourth embodiments. However, these are mere examples, and the technical scope of the present invention is not limited to them. A person skilled in the art could have conceived of various modifications without departing from the spirit of the present invention. Therefore, those modifications should of course be construed as belonging to the technical scope of the present invention.

It should be noted that although the polarizers have been described in each of the first to fourth embodiments of the present application and, for example, the polarizers have already been explained as being formed by liquid crystals, supplementary comments are given here. Although the polarizers are aligned along the grooves formed by the photo-alignment process executed in advance, the direction of alignment and the state of alignment are not changed with any sort of intention after the polarizers have been aligned. For example, unlike in the case of a liquid crystal display device, an operation of switching the state of alignment between display time and non-display time is not executed, and the direction of alignment of the polarizers always remains the same.

What is claimed is:

1. A display device comprising:
    an array substrate arranged with a plurality of pixels each having a light-emitting element;
    a first resin layer covering the plurality of pixels over the array substrate and comprising a first surface opposite to the array substrate, wherein the first surface is subjected to a photo-alignment process;
    polarizers disposed over the first surface and comprising liquid crystal molecules, wherein major axes of the liquid crystal molecules are aligned according to the photo-alignment process; and
    a counter substrate disposed over the first resin layer.

2. The display device according to claim 1, further comprising
    a protective layer that fixes the polarizers, the protective layer being disposed over the first surface.

3. The display device according to claim 1, wherein
    the array substrate and the counter substrate have flexibility.

4. The display device according to claim 1, further comprising
    a protective layer, wherein
    the polarizers are buried in the protective layer.

5. The display device according to claim 1, further comprising
    a protective layer, wherein
    the polarizers are partially buried in the protective layer.

6. The display device according to claim 1, further comprising
    a protective layer made of an organic resin.

7. The display device according to claim 1, wherein
    the liquid crystal molecules are nematic liquid crystal molecules.

8. A method of manufacturing a display device, comprising:
    preparing an array substrate arranged with a plurality of pixels;
    forming a first resin layer covering the plurality of pixels over the array substrate;
    subjecting a first surface of the first resin layer to a photo-alignment process, wherein the first surface is opposite to the array substrate; and
    aligning polarizers comprising liquid crystal molecules, wherein major axes of the liquid crystal molecules are aligned according to the photo-alignment process.

9. The method according to claim 8, further comprising
    forming a protective layer that fixes the polarizers over the first resin layer after having arranged the polarizers.

10. The method of manufacturing a display device according to claim 8, further comprising
    forming a protective layer so that the polarizers are buried in the protective layer.

11. The method of manufacturing a display device according to claim 8, further comprising
    forming a protective layer so that the polarizers are partially buried in the protective layer.

12. The method of manufacturing a display device according to claim 8, further comprising
    forming a protective layer made of an organic resin.

13. The method of manufacturing a display device according to claim 8, wherein
    the liquid crystal molecules are nematic liquid crystal molecules.

* * * * *